United States Patent [19]

Veksler

[11] Patent Number: 5,373,511
[45] Date of Patent: Dec. 13, 1994

[54] METHOD FOR DECODING A REED SOLOMON ENCODED SIGNAL WITH INNER CODE AND APPARATUS FOR DOING SAME

[75] Inventor: Irina E. Veksler, Plantation, Fla.

[73] Assignee: Motorola, Inc., Schaumburg, Ill.

[21] Appl. No.: 877,918

[22] Filed: May 4, 1992

[51] Int. Cl.$^5$ .............................................. G06F 11/10
[52] U.S. Cl. .................................................. 371/37.4
[58] Field of Search .................... 371/37.4, 37.5, 37.7, 371/37.1

[56] References Cited

U.S. PATENT DOCUMENTS

| | | | |
|---|---|---|---|
| 4,413,339 | 11/1983 | Riggle et al. | 371/38 |
| 4,646,301 | 2/1987 | Okamoto et al. | 371/37 |
| 4,649,541 | 5/1987 | Lahmeyer | 371/37 |
| 4,665,523 | 5/1987 | Citron et al. | 371/37 |
| 4,782,490 | 11/1988 | Tenengolts | 371/40 |
| 4,796,260 | 1/1989 | Schilling et al. | 371/39 |
| 4,868,828 | 9/1989 | Shao et al. | 371/5.1 |
| 5,107,503 | 4/1992 | Riggle et al. | 371/37.1 |
| 5,130,990 | 2/1990 | Hsu et al. | 371/37.1 |
| 5,208,815 | 4/1993 | Kojima | 371/37.7 |
| 5,247,579 | 9/1993 | Hardwick et al. | 381/40 |
| 5,323,402 | 2/1994 | Vaccaro et al. | 371/37.1 |

*Primary Examiner*—Robert W. Beausoliel, Jr.
*Assistant Examiner*—Norman Wright
*Attorney, Agent, or Firm*—M. Mansour Ghomeshi

[57] ABSTRACT

A method decodes a digital information signal which has been coded using a first error correction code and then coded again using a second error correction code. This method comprises the steps of decoding (104) and correcting errors (106) in the coded digital information signal using a decoder corresponding to the second error correction code to produce a first corrected signal. In addition, the method includes the steps of decoding the first corrected signal to obtained position of erasures (108). Next, the erasure location polynomial (112) and modified syndrome components (114) are computed followed by generating an error evaluator polynomial (118) when the modified syndrome components are all zeroes (116). The method also includes the step of calculating error values (120) and correcting errors (122)in the first corrected signal to produce the digital information signal.

19 Claims, 4 Drawing Sheets

METHOD FOR DECODING A REED SOLOMON ENCODED SIGNAL WITH INNER CODE AND APPARATUS FOR DOING SAME

TECHNICAL FIELD

This invention relates generally to decoders and methods of decoding a Reed Solomon encoded signal and more particularly to a decoder and method of decoding a Reed Solomon encoded signal having an inner code.

BACKGROUND

Communication devices used in the reception of digital information commonly use one or more error handlers in order to detect and correct errors that may have been introduced in the transmission of a signal. In general, a digital signal is encoded at the transmitter site with a particular error correction scheme. At the receiving end, a receiver reciprocates the encoding steps in order to recover the digital signal. Presently, several different error correction techniques are available in the field with various capabilities. One of these techniques having high reliability uses Reed Solomon codes followed by an inner code. A desirable use of this technique is in high noise environments where data corruption is more severe. Reed Solomon codes, well known in the art, are complicated and involve complicated computational procedures. Communication devices use Digital Signal Processors (DSPs) for the encoding and decoding of their communication signal. In spite of significant advances made in the field of digital signal processors, they still demand high levels of current to decode a Reed Solomon-inner coded signal. In addition to the high levels of current, the computational steps performed by the DSPs take long periods of time, disqualifying them for use in real time detection and correction of errors. Portable communication devices are at a particular disadvantage due to their dependence on battery power. The high index of error recovery of Reed Solomon codes is very attractive to communication devices which are now taking advantage of the digital signal processing of DSPs in meeting previously unavailable options. Due to the time and current drain constraints Reed Solomon codes have not received an enthusiastic welcome in the field of error decoding in portable communication device. It can therefore be seen that a less complicated method that would rapidly decode errors in a Reed Solomon coded signal is highly desired, particularly due to the benefits it offers to portable communication devices.

SUMMARY OF THE INVENTION

Briefly, according to the invention, a method of decoding a digital information signal which has been coded using a first error correction code and then coded again using a second error correction code is disclosed. This method comprises the steps of decoding and correcting errors in the coded digital information signal using a decoder corresponding to the second error correction code to produce a first corrected signal. In addition, the method includes the steps of decoding the first corrected signal to obtain position of erasures. Next, the erasure location polynomial and modified syndrome components are computed followed by generating an error evaluator polynomial when the modified syndrome components are all zeroes. The method also includes the step of calculating error values and correcting errors in the first corrected signal to produce the digital information signal.

In other aspects of the present invention, a communication device is disclosed receiving encoded signals and decoding those signals in accordance with the method described above.

DETAILED DESCRIPTION OF THE PREFERRED EMBODIMENT

Figure 1:
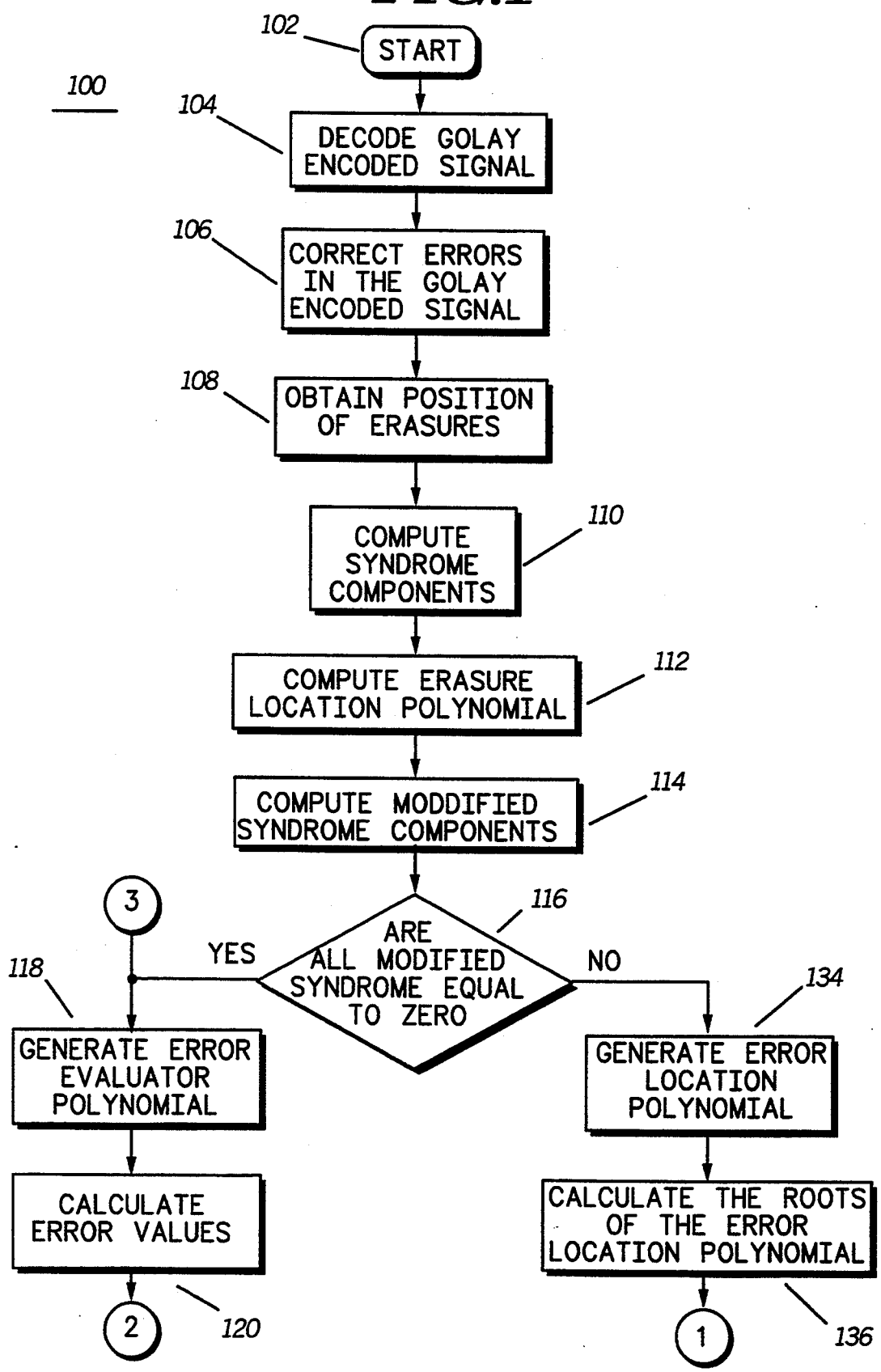
FIGS. 1 and 2 show a flow chart of the error correction scheme in accordance with the present invention.
Figure 2:
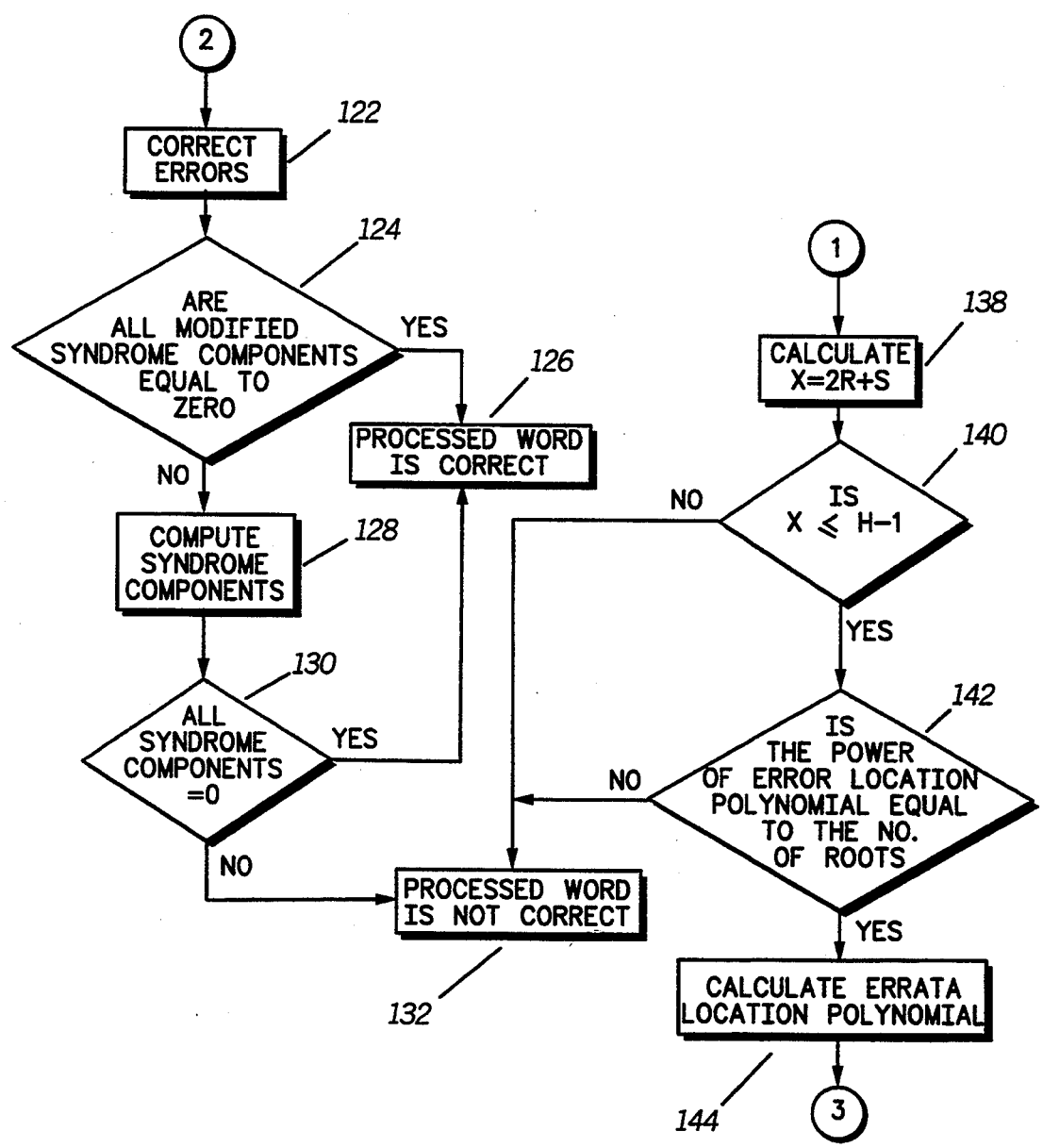

Referring to FIGS. 1 and 2, a flow chart 100 of the detection and correction of errors in accordance with the present invention in a digital information signal which has been coded using Reed Solomon code and coded again using Extended Golay code is shown. From a start block 102, the Extended Golay encoded signal is first decoded via block 104. In the preferred embodiment, this decoding block corrects bit errors using Golay (24,12) format. Received data is presented to the Golay decoder in blocks of ten (24,12) bits or a total of 240 bits. The decoding step of block 104 removes the 120 parity bits in each of the ten (24,12) words leaving behind 120 bits of data forming 10 words. These words are then corrected using Golay error correcting techniques via block 106 to produce a first corrected signal. The error correction of block 106 can correct up to three bit-errors and detect up to four bit-errors. When the Golay decoder detects more errors than it can correct, it marks them as erasures. Erasure is an errata that has a known location within a code word, but an unknown value. On the other hand, an error is an errata for which both the value and the location information are not known. After Golay decoder finishes correcting errors within its capability, it tells Reed Solomon decoder via block 108 the positions of the symbols where the error was detected, but not corrected. In other word, the Reed Solomon decoder obtains the position of erasures from the Golay decoder. Note that the 12 bits of data processed by the Golay decoder are treated as two symbols by the Reed-Solomon decoder. Hence, a symbol comprises six bits of data. To better illustrate the principles of the present invention, an information signal is processed through the flow chart 100. This information signal contains twenty symbols as shown below:

$$\frac{3c}{19} \quad \frac{05}{18} \quad \frac{00}{17} \quad \frac{00}{16} \quad \frac{1d}{15} \quad \frac{01}{14} \quad \frac{04}{13} \quad \frac{3f}{12} \quad \frac{10}{11} \quad \frac{11}{10} \quad \frac{2c}{9} \quad \frac{30}{8}$$

$$\frac{0f}{7} \quad \frac{2e}{6} \quad \frac{16}{5} \quad \frac{27}{4} \quad \frac{d}{3} \quad \frac{16}{2} \quad \frac{23}{1} \quad \frac{2b}{0}$$

For the purpose of this illustration it is assumed that erasures are located in following locations:

0-2-9-11-15-19

The value of erasures is made equal to zero or otherwise replaced with nulls, once their location has been determined.

| 0  | 05 | 0  | 0  | 0  | 1d | 01 | 04 | 0  | 11 | 0 | 30 | 0f |
|----|----|----|----|----|----|----|----|----|----|---|----|----|
| 19 | 18 | 17 | 16 | 15 | 14 | 13 | 12 | 11 | 10 | 9 | 8  | 7  |

| 2e | 1b | 27 | d | 0 | 23 | 0 |
|----|----|----|---|---|----|---|
| 6  | 5  | 4  | 3 | 2 | 1  | 0 |

With the position of erasures known the syndrome components are computed via block 110. A syndrome component is defined in the art as a symbol or a set of symbols containing information about error or errors. In order to compute the syndrome components, the first corrected signal is multiplied with the following matrix:

$$\begin{array}{cccc} 1 & 1 & & 1 \\ \alpha^1 & \alpha^2 & \cdots & \alpha^{(n-k)} \\ \alpha^2 & (\alpha^2)^2 & \cdots & (\alpha^{(N-K)})^2 \\ \alpha^3 & (\alpha^2)^3 & & (\alpha^{(N-K)})^3 \\ \alpha^4 & (\alpha^2)^4 & & (\alpha^{(N-K)})^4 \\ \alpha^5 & (\alpha^2)^5 & & (\alpha^{(N-K)})^5 \\ \vdots & \vdots & & \vdots \\ \alpha^{(N-1)} & (\alpha^2)^{N-1} & \cdots & (\alpha^{(N-K)})^{N-1} \end{array}$$

N is the number of total symbols in a code word. K is the number of data in the code word. So N is 24 and K is 12 in a (24,12) Golay code word. Note that all the mathematical operations (addition and multiplication) have to be performed according to the rules of Galois Field (64) via look up tables. A copy of these look up tables may be found in page 145, table 6.2. of Error Control Coding: Fundamentals and Applications, by Shu Lin and Daniel J. Costello, Jr., published by Prentice-Hall, Inc., Englewood Cliffs, N.J.

The syndrome components are stored in memory for future use. Following this step, the Reed Solomon decoder computes the erasure location polynomial via block 112 using the following formula:

$$\Lambda(x) = \sum_{i=1}^{e} (1 + \alpha^{a_i} x)$$

This formula utilizes the position of erasures obtained previously via block 108. An erasure location polynomial is a polynomial whose roots provide erasure location information. Then the Reed Solomon decoder computes modified syndrome components via block 114. This computation is performed using the following formula:

$$T_{j-e} = \sum_{k=o}^{e} \Lambda_k S_{j-k} \text{ for } j = e + 1, e + 2, \ldots, (N - K)$$

Where:
$T_{j-e}$ = modified syndromes
$\Lambda_k$ = coefficients of erasure location polynomial
$S_{j-k}$ = syndrome components Upon computation of modified syndromes a decision is made as to their values. Condition block 116 decides whether the modified syndromes are all zeros. The NO output of the condition block 116 is coupled to block 134 where the Error Location Polynomial is generated using Berlekamp-Massey Iterative Algorithm. The error location polynomial is a polynomial whose roots provide erasure location information. After this polynomial is generated, Reed Solomon decoder searches for the roots of this polynomial via block 136. The algorithm that searches for the roots of error location polynomial is called a Chien's search. If all the roots are found properly, their reciprocals would be the locations of the errors. Then Reed Solomon decoder checks the following formula via block 140

$$2R + S < \text{or} = H - 1$$

where R is the number of errors found via block 136 and S is the number of erasures obtained via block 108 and H is the Hamming Distance. The hamming distance between two code words, as understood in the field, is defined as the number of corresponding symbol positions in which the two code words differ. The No output of the condition block 140 is coupled to block 132 where a determination is made that the decoded words are incorrect. The YES output of the condition block 140 is coupled to yet another condition block 142 where a comparison of the power of error location polynomial found via block 134 is made with the number of roots found via block 136. The NO output of the condition block 142 is coupled to block 132 indicating that the processed word is incorrect. The YES output of the condition block 142 is coupled to block 144 which calculates errata location polynomial. Errata location polynomial is the product of Error Location Polynomial calculated via block 134 and Erasure Location Polynomial obtained via block 112. The following formula is used in calculating the Errata location polynomial:

$$\sigma(x) = \lambda(x) \cdot \Lambda(x)$$

Where
$\sigma$ = errata location
$\lambda(x)$ = error location polynomial
$\Lambda(x)$ = erasure location polynomial Upon calculating the errata location polynomial the operation is coupled to block 118 where the Error Evaluator Polynomial is calculated using the following formula:

$$\omega(x) = 1 + (S_1 + \sigma_1)x + (S_2 + \sigma_1 S_1 + \sigma_2)X^2 + \ldots \\ + (S_v + \sigma_1 S_{v-1} + \sigma_2 S_{v-2} + \ldots \sigma_v)x^v$$

where
V = # of erasures + # of errors.
and S is syndrome components

The above formula utilizes errata location polynomial computed via block 144 and syndrome components computed via block 110. The next step comprises block 120 which calculates error values using the following formula:

$$Y_k = \frac{\omega(\alpha^{63-ak})}{V \prod_{i=1 \text{ and } i \neq K} (1 + \alpha^{ai-ak})}$$

This formula is known in the field as Forney's algorithm and uses error evaluator polynomial found via block 118, the reciprocals of the roots found via block 136 and positions of erasures obtained via block 108. Once this block is completed, Reed Solomon knows all the positions of errors and the corresponding values. So it proceeds to block 122 which corrects all the errors and erasures. Then Reed Solomon Decoder proceeds to block 128, which computes the syndrome components of the corrected symbols. Then it proceeds to block 130, which tests the syndrome components. If all syndrome components are equal to zero it proceeds to block 126 informing the system that the received word is correct. If at least one of the syndrome components is not zero, the decoder proceeds to block 132 indicating that the decoded word is incorrect.

The YES output of the condition block 116 is coupled to block 118 followed by blocks 122 and 126. These three simple steps are taken as the result of the condition block 116 producing a YES output. The introduction of the condition block 116 to the detecting and correcting of errors avoids the normal path of decoding Reed-Solomon coded signals with inner code. It has been determined that the probability of this condition block resulting in a YES is better than 80% with 10% bit error rate (BER). It is for the addition of this alternate path that the decoding of Reed-Solomon coded signal with inner code may be greatly simplified. This simplified path requires much less time to implement removing some of the burden from the decoders. In the preferred embodiment, a Digital Signal Processor (DSP) is used for the implementation of the flow chart 100. This DSP consumes significantly less current when implementing the alternative path in accordance with the present invention.

Following the operation of the flow chart 100, a saving of better than 50% may be realized if the number of erasures is two in a thirty two symbol word. A saving of better that 45% may be realized with six erasures with the same number of symbol words. The minimum saving may be realized with ten erasures. This saving is calculated to be better than 35%.

Figure 3:
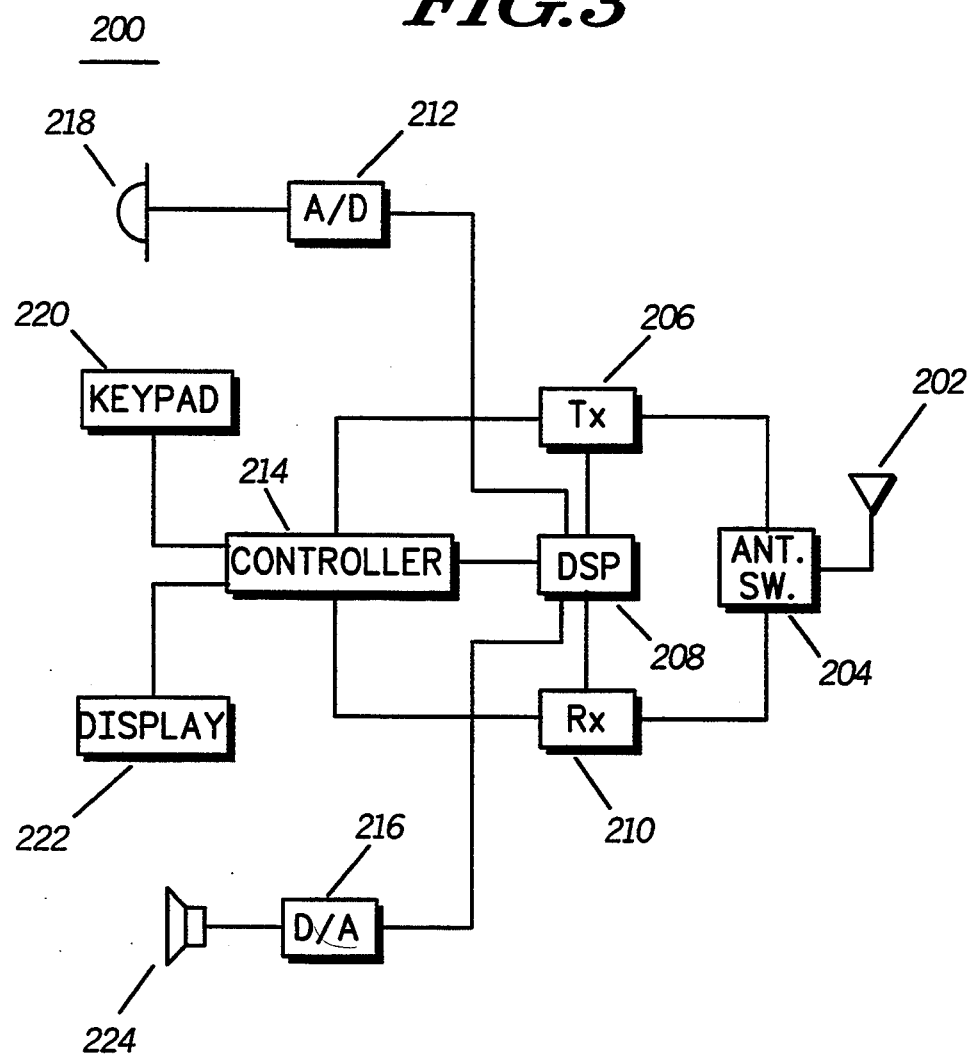
FIG. 3 is a block diagram of a communication device in accordance with the present invention.

Referring to FIG. 3, a block diagram of a communication device 200 is shown in accordance with the present invention. A radio frequency signal received at an antenna 202 is coupled to a receiver 210 via an antenna switch 204. Coupled to the antenna switch 204 is a transmitter 206 that provides transmission of signals for the device 200. The antenna switch 204 couples the transmitter 206 or the receiver 210 to the antenna 202 in accordance with the operation of radio communication devices, well known in the art. The receiver 210 demodulates and couples the received signal to a Digital Signal Processor (DSP) 208 and a controller 214. In general, the DSP 208 is used for the processing of audio components of the received signal and the controller 214 is used for the processing of data components of the received signals. These data components include address, framing information, and general transmission data that are used by the controller 214 to generate information about the received signal. Other data components may include display information that are appropriately displayed on a display 222. The DSP 208 receives the audio components of the received signal from the receiver 210 and processes them accordingly. These components are stripped off of error codings and then presented to a digital to analog converter (D/A) 216 for a conversion back to analog before they are applied to a speaker 224. In the preferred embodiment, three types of error detection and correction are used. A first type is used for the correction of errors detected in the audio portion of the received signal. The error correction used for the audio components may be any of the several well known error correction schemes, such as: Hamming, Golay, etc. A second type of error detection and correction is used for the errors detected in the data components of the received signal that are aimed for the display. This error correction uses Cyclic Redundancy Check (CRC) and parity check. A third error correction is used for the data components that are not displayed, such as framing data, address information, etc. The error detection and correction used for this third category of data information is in accordance with the present invention as explained earlier with flow chart 100. In the preferred embodiment, the non-display data information is encoded first with Reed Solomon code and then inner coded with Extended Golay.

In the transmit mode, the information entered via a keypad 220 is coupled to the controller 214. The information entered via a microphone 218 are converted to digital via an analog to digital converter (A/D) 212 and then coupled to the DSP 208. The controller 214 and the DSP 208 proceed to encode the keyboard and microphone information with error correction codes before they are coupled to the transmitter 206 for transmission. The transmitter 206 provides such functions as amplification, modulation, and filtering of the radio frequency signal. The modulated signal is applied to the antenna 202 via the antenna switch 204.

Figure 4:
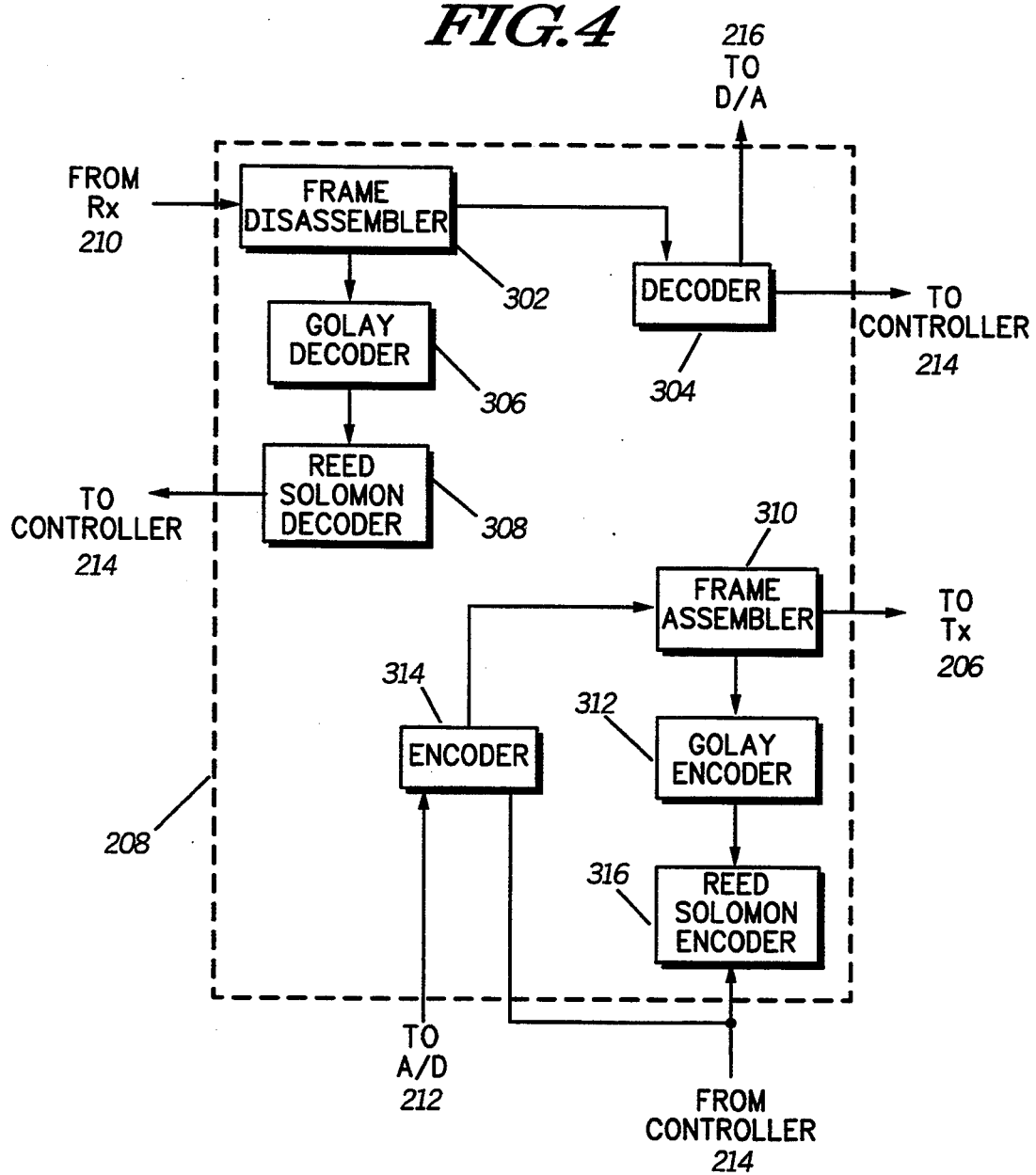
FIG. 4 is a block diagram of a DSP used in the communication device of FIG. 3 in accordance with the present invention.

Referring now to FIG. 4, a block diagram of the components of the DSP 208 performing the error coding and encoding in accordance with the present invention is shown. The received signal from the receiver 210 is coupled to a frame disassembler 302 where various components of a received frame are disassembled. The disassembled frames are coupled to a Golay decoder 306 and an error decoder 304. The Golay decoder provides the first decoding of the received signal in a path leading to the rapid decoding and correcting of errors in the Reed-Solomon encoded symbols. As has already been mentioned, the probability of the Golay decoder 306 detecting all the symbols with error is better than 80% with 10% bit error rate (BER)..As part of its operation, the Golay decoder 306 corrects errors that are associated with the Golay inner codes. The signal at the output of the Golay decoder 306 is coupled to a Reed Solomon decoder 308 for further processing. The Reed Solomon decoder 308 provides the second decoder in accordance with the present invention. The Reed Solomon decoder 308 proceeds to detect and correct errors in the received symbols in accordance with the flow chart 100. Corrected frames are then coupled from the Reed Solomon decoder 308 to the controller 214 for the analyzing of the address segment and framing information. The controller 214 decodes the address and the framing information to acquire knowledge on the characteristics of the received signal.

The decoder 304 receives the disassembled frames from the disassembler 302. In the preferred embodiment, these frames represent display and voice. The decoder 304 proceeds to correct these errors. Portions of this signal is coupled to the D/A converter 316 for presentation to the user via the speaker 224. Display information after being decoded by the decoder 304 are coupled to the controller 214 for further processing and subsequent presentation on the display 222. Similarly, on the transmit side, signals from the controller 214 are coupled to a Reed Solomon encoder 316 and encoder 314. Once again, in the preferred embodiment, framing and addressing information are routed to the Reed Solomon encoder while audio information, after being converted to digital via the A/D converter 212, and keypad information are coupled to the encoder 314. The output of the encoder 314 is coupled to a frame assembler 310 where frames are assembled into a bit stream of data. The Reed Solomon encoder 316 encodes the signal from the controller 214 and couples it to a Golay encoder 312 for inner coding. The Golay encoded signals are then applied to the frame assembler 310 where they are assembled with the signals from the encoder 314 and presented to the transmitter 206 for transmission.

It can be seen that by using the flow chart 100, significant time consuming steps are eliminated from the process of decoding Reed Solomon coded signals. Indeed, better than 80% of Reed Solomon encoded signals result in all of their modified syndrome components being zeroes. That is, not having to proceed with a complicated error correction process. Using a simplified error correction process allows the use of highly accurate Reed Solomon coded schemes in such devices as portable communication devices where power is of premium value, along with decoding time and speed. The principles of the present invention allow the use of more complicated coding schemes with real time processing of digital information signals.

Although the presentation of the preferred embodiment of the present invention stipulates the use of Reed Solomon decoders for a portion of the digital information signal being received, it is well understood that Reed Solomon decoding schemes may be used for all components of a received signal. Those skilled in the art appreciate that because of the significance of the addressing and framing information of a signal one may wish to have these segments encoded with Reed Solomon which is a more complicated and detailed error detection and correction scheme. Further improvements in digital signal processing speed and current consumption will allow the efficient use of the principles of the present invention for decoding and correcting of all components of a signal received by a receiver using Reed Solomon decoders.

What is claimed is:

1. A method of decoding and correcting errors in a digital information signal which has been coded using a first error correction code and coded again using a second error correction code, comprising the steps of:
   in a first decoder, decoding the coded digital information signal to produce a decoded digital information signal;
   correcting errors in the decoded digital information signal using the first decoder in order to provide a first corrected signal;
   in a second decoder, decoding the first corrected signal to obtain position of erasures;
   computing an erasure location polynomial and modified syndrome components;
   detecting when the modified syndrome components are all zeroes;
   generating an error evaluator polynomial in response to the modified syndrome components being all zeros;
   calculating error values; and
   correcting errors in the first corrected signal to reproduce the digital information signal.

2. The method of claim 1, further including the steps of:
   generating an error location polynomial when at least one of the modified syndrome components has a value other than zero, the error location polynomial having a polynomial power;
   calculating roots of the error location polynomial to determine location of errors and number of roots;
   sensing when the polynomial power is equal to the number of roots of the error location polynomial;
   generating error evaluator polynomials;
   calculating error values; and
   correcting any errors in the digital information signal.

3. The method of claim 2, further including the steps of:
   computing syndromes; and
   indicating that the digital information signal can not be corrected when the modified syndrome is not zero.

4. The method of claim 2, wherein the step of generating an error location polynomial uses Berlekamp-Massey error location algorithm.

5. The method of claim 2, further including the step of determining when $\{2R+S<=(H-1)\}$ after calculating the roots of the error location polynomial, where R is the number of errors, S is the number of erasures, and H is the hamming distance.

6. The method of claim 2, wherein the step of calculating the roots of the error location polynomial includes the performing the Chien's search.

7. The method of claim 1, wherein the step of computing the modified syndromes includes the steps of:
   computing syndrome components; and
   computing erasure location polynomials.

8. The method of claim 1, wherein the step of calculating error values includes calculating the error values using Forney's algorithm.

9. A method of decoding and correcting errors introduced during transmission of a transmitted and digitally encoded digital information signal which includes a frame of data bits separated to form a plurality of symbols, the symbols are coded with inner codes after being Reed-Solomon coded, the method comprising the steps of:
   receiving the transmitted and digitally encoded signal to produce a received frame of data bits;
   in a first decoder, decoding the received frame of data bits to remove the inner codes;
   correcting errors associated with inner codes to produce at least one Reed-Solomon coded frame of data bits;
   in a second decoder, decoding the at least one Reed-Solomon coded frame of data bits to obtain position of erasures;
   computing an erasure location polynomial;
   computing modified syndrome components;
   detecting when all modified syndrome components are zeroes;
   generating an error evaluator polynomial in response to all modified syndrome components being zero;
   calculating error values using Forney's algorithms;

correcting errors in the at least one Reed-Solomon coded frame of data bits to reproduce the digital information signal.

10. The method of claim 9, further including the steps of:
  generating an error location polynomial when at least one of the modified syndrome components has a value other than zero, the error location polynomial having a polynomial power;
  calculating roots of the error location polynomial to determine error locations and establish number of error locations;
  sensing when the polynomial power is equal to the number of error locations;
  correcting errors in the at least one Reed-Solomon coded frame of data bits to reproduce the digital information signal.

11. The method of claim 10, further including the steps of:
  computing syndromes; and
  indicating that the received frame of data bits can not be corrected when the modified syndrome is not zero.

12. The method of claim 9, wherein the step of computing the modified syndromes includes the steps of:
  computing syndrome components; and
  computing erasure location polynomials.

13. A communication device, comprising:
  a receiver for receiving a digital information signal that is Reed Solomon coded and having an inner code to produce a received distal information signal;
  a first decoder for decoding the digital information signal;
  means for correcting errors associated with the inner codes to produce a first signal;
  a second decoder for decoding the first signal to obtain position of erasures;
  means for computing an erasure location polynomial;
  means for computing modified syndrome components;
  detector means for detecting when all modified syndromes are zeros;
  generator means for generating error evaluator polynomial in response to all modified syndromes being zero;
  calculator means for calculating error values; and
  means for correcting errors in the first signal to reproduce the digital signal.

14. The communication device of claim 13, further including:
  first generator means for generating an error location polynomial when at least one of the modified syndrome components has a value other than zero, the error location polynomial having a polynomial power;
  means for calculating roots of the error location polynomial to determine location of errors and number of roots;
  sensor means sensing when the polynomial power is equal to the number or roots of the error location polynomial;
  second generator means for generating error evaluator polynomials;
  means for calculating error values; and
  means for correcting any errors in the digital information signal.

15. The communication device of claim 14, wherein the first generator means includes means for generating Berlekamp-Massey error location algorithm.

16. The communication device of claim 14, further including means for determining when $2R+S<=H-1$ after calculating the roots of the error location polynomial, where R is the number of erasures, S is the number of errors, and H is the hamming distance.

17. The communication device of claim 14, wherein the means for calculating the roots of the error location polynomial includes a means for performing Chien's search.

18. The communication device of claim 13, wherein the means for computing the modified syndromes includes:
  means for computing syndrome components; and
  means for computing erasure location polynomials.

19. The communication device of claim 13, wherein the means for calculating error values includes means for calculating the error values using Forney's algorithm.

* * * * *